US011770945B2

(12) United States Patent
Wang et al.

(10) Patent No.: US 11,770,945 B2
(45) Date of Patent: Sep. 26, 2023

(54) FOLDABLE SCREEN DEVICE, SUPPORTING DEVICE AND SUPPORTING STRUCTURE

(71) Applicant: BOE Technology Group Co., Ltd., Beijing (CN)

(72) Inventors: Xinyu Wang, Beijing (CN); Shangchieh Chu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 305 days.

(21) Appl. No.: 17/359,618

(22) Filed: Jun. 27, 2021

(65) Prior Publication Data

US 2022/0102672 A1 Mar. 31, 2022

(30) Foreign Application Priority Data

Sep. 30, 2020 (CN) .......................... 202011067658.6

(51) Int. Cl.
*H05K 5/00* (2006.01)
*H10K 50/84* (2023.01)
*H10K 102/00* (2023.01)

(52) U.S. Cl.
CPC ....... *H10K 50/84* (2023.02); *H10K 2102/311* (2023.02)

(58) Field of Classification Search
CPC ...................................................... H05K 7/00
See application file for complete search history.

(56) References Cited

U.S. PATENT DOCUMENTS

| 2017/0139663 A1* | 5/2017 | Ahn | G09G 3/2092 |
| 2019/0324501 A1* | 10/2019 | Kim | H05K 5/0017 |

FOREIGN PATENT DOCUMENTS

CN 110360431 A 10/2019

\* cited by examiner

*Primary Examiner* — Jerry Wu
(74) *Attorney, Agent, or Firm* — IPRO, PLLC

(57) ABSTRACT

A supporting structure, including: a carrying plate configured to carry a foldable screen; a supporting assembly comprising two supporting members, each of which are rotatably connected to the carrying plate; a coupling shaft located between the two supporting member and disposed parallel to the carrying plate and rotation axes of the two supporting members; and a connecting assembly, comprising a first connecting piece and a second connecting piece, the first connecting piece rotatably connected to the first supporting member and the coupling shaft respectively, and the second connecting piece rotatably connected to the second supporting member and the coupling shaft respectively; wherein, in a case that the coupling shaft is at a first position, the supporting structure is in a storage state; and in a case that the coupling shaft is at a second position, the two supporting members are configured to support the carrying plate.

16 Claims, 8 Drawing Sheets

FOLDABLE SCREEN DEVICE, SUPPORTING DEVICE AND SUPPORTING STRUCTURE

CROSS REFERENCES TO RELATED APPLICATIONS

The present disclosure claims the priority of a Chinese patent application filed with National Intellectual Property Administration, P.R.C. under CN 202011067658.6 and titled "Bonding Device and Bonding Method" on Sep. 30, 2020, the entire content of which is incorporated into the present disclosure by reference.

TECHNICAL FIELD

Embodiments of the present disclosure relate to a foldable screen device, a supporting device, and a supporting structure.

BACKGROUND

Organic electroluminescence display panels are a new generation of display products following liquid crystal display panels. Due to their better color saturation, fast response, foldability, thinness, light and other properties, they are gradually becoming the mainstream and the leader in the display field.

For current organic electroluminescence display panels, people can make it into a foldable screen. During operation, the foldable screen is unfolded so that people can watch images conveniently. In a case of not in use, the foldable screen can be directly rolled up and stored in a receiving box to protect the foldable screen. However, during the use of the foldable screen, there is no supporting structure which supports the foldable screen in unfolded state, which is inconvenience for the foldable screen to use.

SUMMARY

At least one embodiment of the present disclosure provides a supporting structure, including: a carrying plate, configured to carry a foldable screen; a supporting assembly, including a first supporting member and a second supporting member, the first supporting member and the second supporting member both rotatably connected to the carrying plate; a first coupling shaft, located between the first supporting member and the second supporting member and disposed parallel to the carrying plate and parallel to both a rotation axis of the first supporting member and a rotation axis of the second supporting member; and a first connecting assembly, including a first connecting piece and a second connecting piece, the first connecting piece rotatably connected to the first supporting member piece and rotatably connected to the first coupling shaft, and the second connecting piece rotatably connected to the second supporting member and rotatably connected to the first coupling shaft; wherein, in a case that the first coupling shaft is located at a first position, both an end of the first connecting piece away from the first coupling shaft and an end of the second connecting piece away from the first coupling shaft are located at a side of the first coupling shaft away from the carrying plate in a direction perpendicular to the carrying plate, the first connecting piece and the second connecting piece form a first included angle, and both the first supporting member and the second supporting member are inclined with respect to the carrying plate; and in a case that the first coupling shaft is located at a second position, the first connecting piece and the second connecting piece form a second included angle, and the first supporting member and the second supporting member are disposed opposite to each other so as to support the carrying plate, wherein the second position is on a side of the first position away from the carrying plate.

In some embodiments of the present disclosure, the first connecting piece includes a telescopic member which is sleeved on the first coupling shaft and disposed adjacent to the second connecting piece in an axial direction of the first coupling shaft; and the second connecting piece includes a recessed portion disposed on a side of the second connecting piece facing the first connecting piece; wherein in a case that the first coupling shaft is located at one position of the first position and the second position, the telescopic member enters the recessed portion, and in a case that the first coupling shaft is located at the other position of the first position and the second position, the telescopic member comes out of the recessed portion and abuts against the second connecting piece.

In some embodiments of the present disclosure, the first coupling shaft includes a first limiting member and a second limiting member which are provided on a circumferential surface of the first coupling shaft and disposed apart from each other in the axial direction of the first coupling shaft; the telescopic member includes an elastic member and a first sleeve which is rotatably sleeved on the first coupling shaft and is movable in the axial direction of the first coupling shaft; the second connecting piece includes a second sleeve which is rotatably sleeved on the first coupling shaft; the elastic member abuts the first limiting member and the first sleeve and disposed between the first limiting member and the first sleeve, the second sleeve abuts the first sleeve and the second limiting member and is disposed between the first sleeve and the second limiting member; and the first sleeve includes a protruding portion disposed on an end surface of the first sleeve facing the second sleeve, and the recessed portion is provided on an end surface of the second sleeve facing of the first sleeve; wherein, in a case that the first coupling shaft is located at one of the first position and the second position, the protruding portion enters the recessed portion; and in a case that the first coupling shaft is located at the other of the first position and the second position, the protruding portion abuts an area other than the recessed portion of the end surface of the second sleeve facing the first sleeve.

In some embodiments of the present disclosure, the protruding portion has a first abutting surface, and the end surface of the second sleeve facing the first sleeve has a second abutting surface in an area other than the recessed portion, both the first abutting surface and the second abutting surface are perpendicular to the axial direction of the first coupling shaft; and in a case that the first coupling shaft is located at the other of the first position and the second position, the first abutting surface engages the second abutting surface.

In some embodiments of the present disclosure, there are two protruding portions and two recessed portions, and the two protruding portions correspond to the two recessed portions respectively, and the two protruding portions are arranged along the radial direction of the first coupling shaft.

In some embodiments of the present disclosure, the carrying plate, the first supporting member and the second supporting member all have a strip structure and extend along the axial direction of the first coupling shaft; the supporting structure further includes a second coupling shaft and a second connecting assembly, the first coupling shaft and the second coupling shaft are coaxially arranged and spaced apart; and the second connecting assembly includes a third connecting piece and a fourth connecting piece, the third connecting piece is rotatably connected to the first supporting member and is rotatably connected to the second coupling shaft, and the fourth connecting piece is rotatably connected to the second supporting member and rotatably connected to the second coupling shaft.

At least one embodiments of the present disclosure provides a supporting device, including:

a supporting shaft; and a plurality of supporting structures according claim 1, which are connected in sequence, the first coupling shafts of the plurality of supporting structures are all parallel to the supporting shaft, and two adjacent supporting structures are rotatably connected; wherein, in a case that the first coupling shafts of the plurality of supporting structures are located at the first position, the plurality of the supporting structures are operatively wounded around the supporting shaft, and for each supporting structure wounded around the supporting shaft, the first coupling shaft is located on a side of the carrying plate adjacent to the supporting shaft; and in a case that the first coupling shafts of the plurality of supporting structures are located at the second position, the carrying plates of the plurality of supporting structures are arranged on a plane and are configured to jointly carry the foldable screen.

In some embodiments of the present disclosure, the supporting device further includes:

a housing, wherein the support shaft pivoted to the inner wall of the housing;

a cylindrical member having a first opening end and a second opening end in an axial direction thereof, the cylindrical member connected to the housing at the first opening end and communicating with inside of the housing, wherein an inner surface of the cylinder member is provided with a guide; and wherein some of the supporting structures of the plurality of supporting structures enter the cylindrical member at the first opening end, and come out of the cylindrical member at the second opening end; in a case that the supporting shaft rotates in a first direction, the supporting structure in the cylindrical member moves toward the first opening end, and the guide guides the first coupling shaft to approach the carrying plate so that the first coupling shaft moves to the first position; and in a case that the supporting shaft rotates in a second direction opposite to the first direction, the supporting structure in the cylindrical member moves toward the second opening end, and the guide guides the first coupling shaft to move away from the carrying plate, so that the first coupling shaft moves to the second position.

In some embodiments of the present disclosure, the inner surface of the cylindrical member includes a top surface and a bottom surface that are disposed opposite to each other and a side surface connecting the top surface and the bottom surface; the guide includes a guide groove provided in the side surface, wherein a distance between the guide groove and the top surface gradually increases in a direction from the first opening end to the second opening end; and for each supporting structure in the cylindrical member, the first surface thereof faces the top surface and is parallel to the top surface, and the first coupling shaft is slidingly engaged in the guide groove.

In some embodiments of the present disclosure, each of the supporting structure includes a first fixing shaft and a second fixing shaft respectively disposed a side of the carrying plate with respect to the first coupling shaft, the first fixing shaft and the second fixing shaft are disposed parallel to the coupling shaft, and the supporting device further includes:

a coupling member, having a first shaft hole and a second shaft hole disposed parallel to each other, wherein, for two adjacent supporting structures, the first shaft hole is rotatably sleeved on the first fixing shaft of one supporting structure of the two adjacent supporting structures, and the second shaft hole is rotatably sleeved on the second fixing shaft of the other supporting structure of two adjacent supporting structures, so that the two adjacent supporting structures are rotatably connected.

In some embodiments of the present disclosure, the first supporting member is rotatably sleeved on the first fixing shaft, and the second supporting member is rotatably sleeved on the second fixing shaft, so that the supporting assembly is rotatably connected to the carrying plate; in the case that a plurality of the supporting structures are wounded around the supporting shaft, for two supporting structures which are adjacent to each other in a circumferential direction of the supporting shaft, surfaces of the supporting assemblies away from the first coupling shaft thereof are mated with each other.

In some embodiments of the present disclosure, surfaces of the first supporting member and the second supporting member of one supporting structure away from the first coupling shaft thereof are flush with surfaces of the first supporting member and the second supporting member of the other supporting structure away from the first coupling shaft thereof in the radial direction.

In some embodiments of the present disclosure, each of the plurality of supporting structures includes two bumps disposed on a surface of the carrying plate configured to carry the foldable screen and arranged apart in the axial direction of the first coupling shaft, and the foldable screen is located between the two bumps.

In some embodiments of the present disclosure, for two supporting structures which are adjacent to each other in a radial direction of the supporting shaft, the supporting assembly of the supporting structure that is relatively far from the supporting shaft is lapped on the two bumps of the supporting structure that is relatively close to the supporting shaft.

In some embodiments of the present disclosure, the plurality of supporting structures includes a plurality of supporting structure groups, the numbers of supporting structures of respective supporting structure groups are the same, and a size of the supporting structures of respective supporting structure group are the same, and each support structure group form a circle around the support shaft in a wounded state.

At least one embodiment of the present disclosure provides a foldable screen device, including:

the supporting device as described above, and a foldable screen carried on the carrying plate of each supporting structure.

DESCRIPTION OF REFERENCE SIGNS

Figure 1:
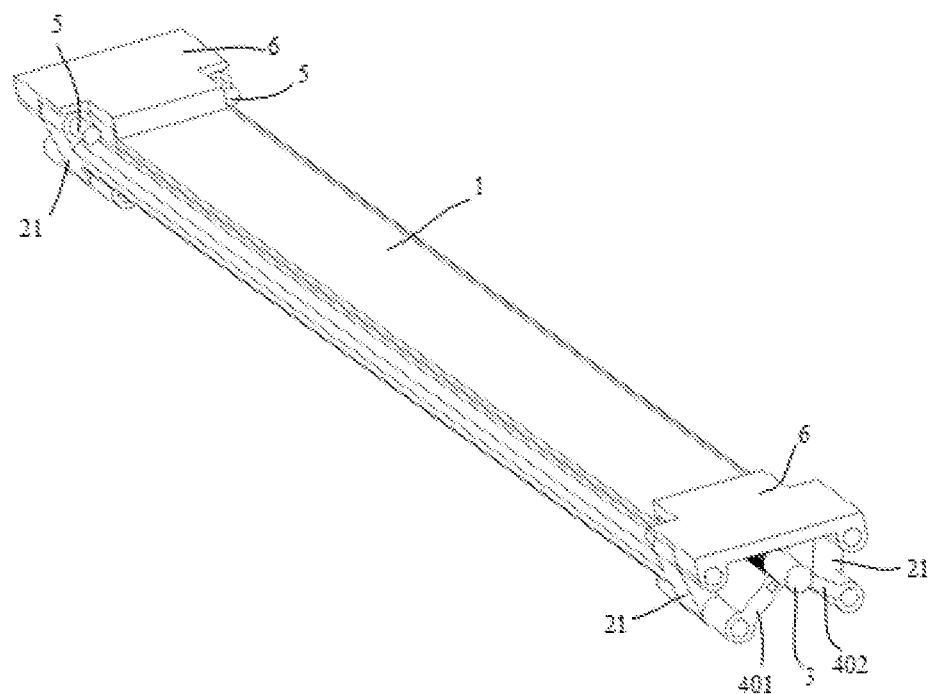
FIG. 1 illustrates a schematic view of a supporting structure according to an embodiment of the present disclosure.

1. Carrying Plate; 2. Supporting Assembly; 201, First Supporting Member; 202, Second Supporting Member; 3. First Coupling Shaft; 301, First Limiting Member; 302, Second Limiting Member; 303, Snap Groove; 4. First Connecting Assembly; 401, First Connecting Piece; 4011, Sliding Groove; 402, Second Connecting Piece; 403, First Sleeve; 4031, Protruding Portion; 40311, First Abutting Surface; 4032, Slider; 404, Elastic Member; 405, Second Sleeve; 4051, Recessed Portion; 4052, Second Abutting Surface; 5. Fixing Shaft; 6, Bumps; 8, Coupling Member; 801, Shaft Hole; 9, Housing; 10. Supporting Shaft; 11. Foldable Screen; 12. Cylindrical Member; 13. Guide.

DETAILED DESCRIPTION OF THE EMBODIMENTS

Here, exemplary embodiments will be described in detail, and examples thereof are illustrated in the accompanying drawings. In a case that following description refers to the drawings, unless otherwise indicated, the same numbers in different drawings indicate the same or similar elements. The implementations described in the following exemplary embodiments do not represent all the implementations consistent with the present disclosure. On the contrary, they are merely examples of devices consistent with some aspects of the present disclosure as detailed in the appended claims.

The terms used in the present disclosure are only for the purpose of describing exemplary embodiments, and are not intended to limit the present disclosure. Unless otherwise defined, the technical terms or scientific terms used in the present disclosure shall have the common meanings understood by one of ordinary skill in the art to which this disclosure pertains. The "first", "second" and similar words used in the specification and claims of the present disclosure do not indicate any order, quantity or importance, but are only used to distinguish different components. Similarly, similar words such as "an" or "a" do not mean a quantity limit, but mean that there is at least one. "Plurality of" or "several" means two or more than two. "Including" or "comprising" and other similar words mean that the elements or items before "including" or "comprising" cover the elements or items listed after "including" or "including" and their equivalents, and do not exclude other elements Or objects. Similar words such as "connected" or "linked" are not limited to physical or mechanical connections, and may include electrical connections, whether direct or indirect. The singular forms of "a", "said" and "the" used in the specification of the present disclosure and the appended claims are also intended to include plural forms, unless the context clearly indicates other meanings. It should also be understood that the term "and/or" as used herein refers to and includes any or all possible combinations of one or more associated listed items.

Figure 3:
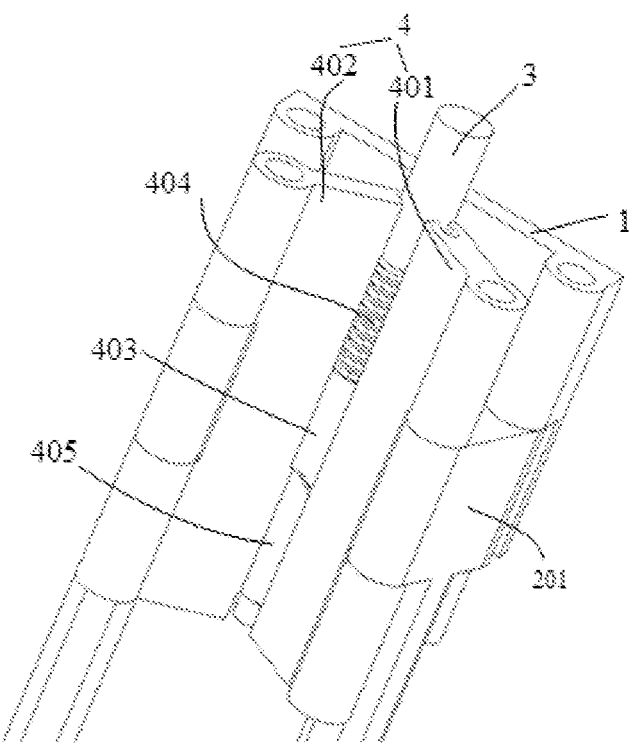
FIG. 3 illustrates a partial schematic view of a supporting structure according to an embodiment of the present disclosure.
Figure 4:
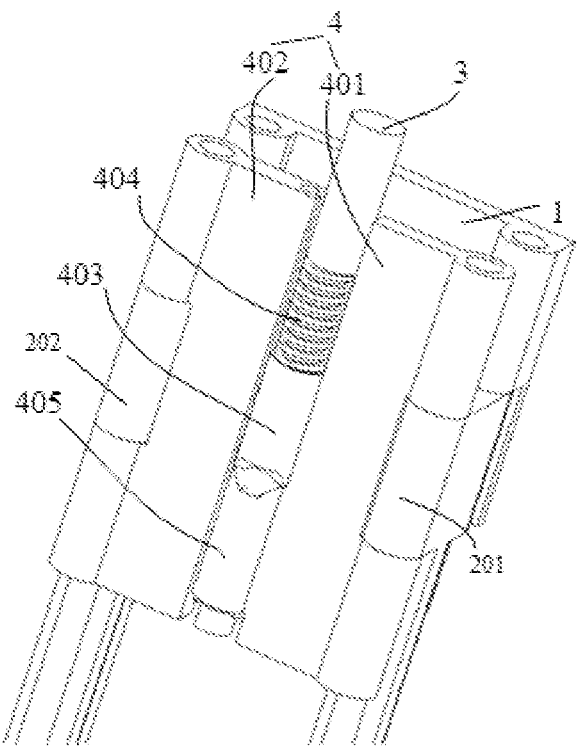
FIG. 4 illustrates a partial schematic view of a supporting structure according to another embodiment of the present disclosure.
Figure 5:
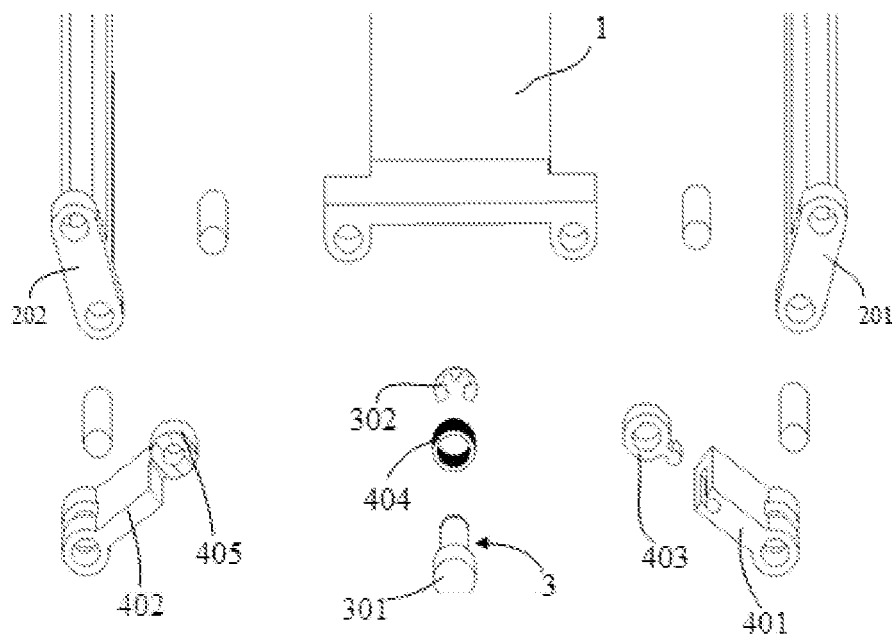
FIG. 5 illustrates an exploded prospective view of the structure as illustrated in FIG. 3.
Figure 6:
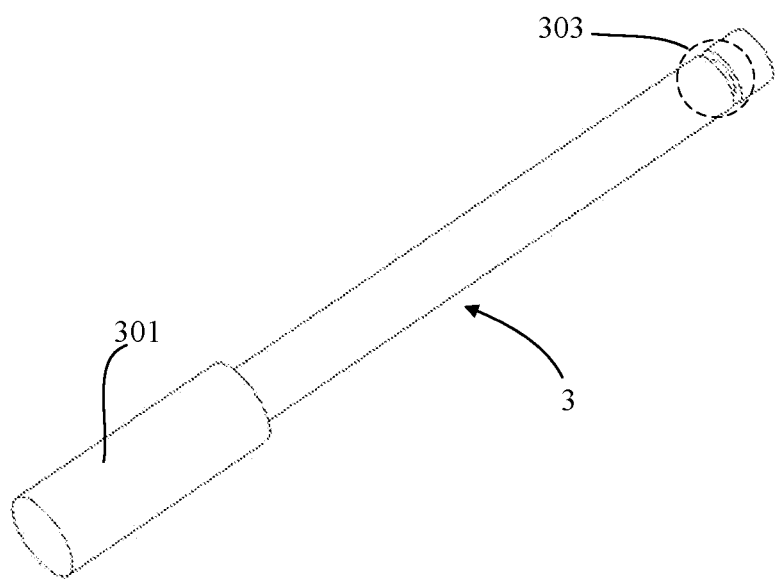
FIG. 6 illustrates a schematic view of a first coupling shaft of a supporting structure according to an embodiment of the present disclosure.

Embodiments of the present disclosure provide a supporting structure. As illustrated in FIGS. 1 to 5, the supporting structure may include a carrying plate 1, a supporting assembly 2, a first coupling shaft 3, and a first connecting assembly 4, wherein:

the carrying plate 1 is configured to carry a foldable screen. The supporting assembly 2 includes a first supporting member 21 and a second supporting member 22, and the first supporting member 21 and the second supporting member 22 may be rotatably connected to the carrying plate 1, and the first rotation axis of the first supporting member 21 and the second rotation axis of the second supporting member 22 are both parallel to the carrying plate. The first coupling shaft 3 is located between the first supporting member 21 and the second supporting member 22, and is arranged parallel to the rotation axis of the first supporting member 21 and the rotation axis of the second supporting member 22, and is parallel to the carrying plate 1. The first connecting assembly 4 includes a first connecting piece 401 and a second connecting piece 402, the first connecting piece 401 is rotatably connected to the first supporting member 21, and the second connecting piece 402 is rotatably connected to the second supporting member 22, and the first connecting piece 401 and the second connecting piece 402 are both rotatably connected with the first coupling shaft 3. As illustrated in FIG. 3, in a case that the first coupling shaft 3 is located at a first position, a first end of the first connecting piece 401 away from the first coupling shaft 3 and a first end of the second connecting piece 402 away from the first coupling shaft 3 are both located at a side of the first coupling shaft 3 away from the carrying plate 1 in a direction perpendicular to the carrying plate 1, and an included angle between the first connecting piece 401 and the second connecting piece 402 is kept at a first angle, the first supporting member 21 and the second supporting member 22 are both inclined with respect to the carrying plate 1; as illustrated in FIG. 4, in a case that the first coupling shaft 3 is located at a second position, the included angle between the first connecting piece 401 and the second connecting piece 402 is kept at a second angle, the first supporting member 21 and the second supporting member 22 are disposed at a respective side of the first coupling shaft 3 and parallel to each other, so as to support the carrying plate 1, wherein the second position is located on a side of the first position away from the carrying plate 1.

In the supporting structure according to the embodiment of the present disclosure, in a case that the first coupling shaft 3 is located at the first position, the included angle between the first connecting piece 401 and the second connecting piece 402 is kept at the first angle, and the first supporting member 21 and the second supporting member 22 are both inclined with respect to the carrying plate 1 so that the supporting structure is in a storage state; in a case that the first coupling shaft 3 moves from the first position to the second position in the direction away from the carrying plate 1, the included angle between the first connecting piece 401 and the second connecting piece 402 is kept at a second angle, and the first supporting member 21 and the second supporting member 22 are located at a respective side of the first coupling shaft 3 and disposed parallel to each other, so as to support the carrying plate 1, and in turn, to support the foldable screen through the carrying plate 1.

Each component of the supporting structure according to the embodiment of the present disclosure will be described in detail hereinafter.

Figure 2:
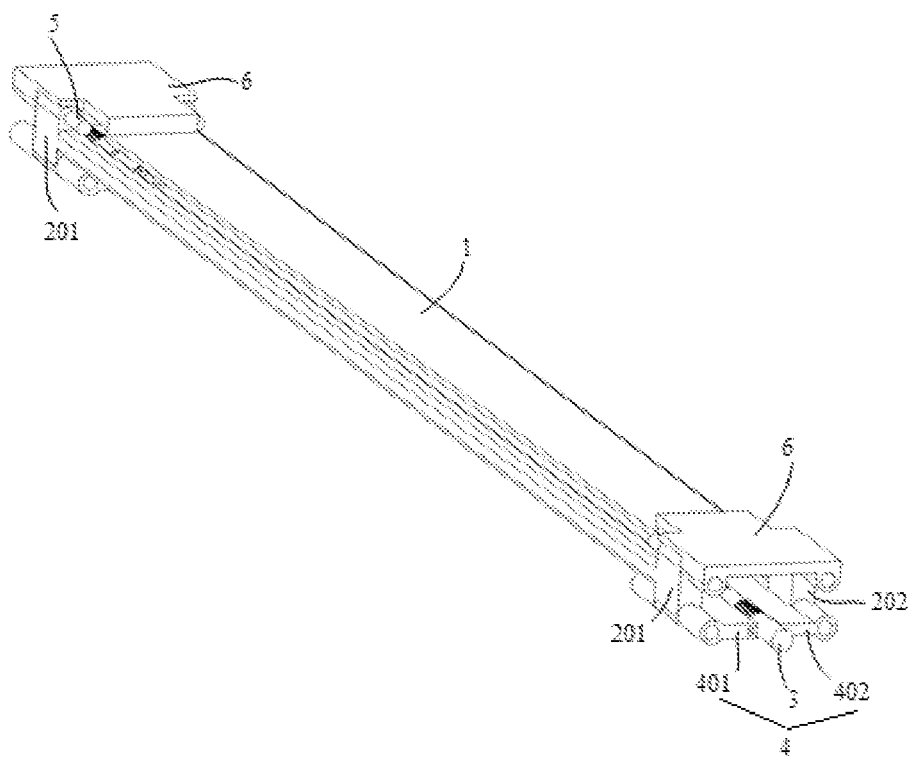
FIG. 2 illustrates a schematic view of a supporting structure according to another embodiment of the present disclosure.

As illustrated in FIGS. 1 and 2, the carrying plate 1 is configured to carry a foldable screen. The carrying plate 1 includes a first surface and a second surface that are disposed opposite to each other. The first surface is configured to carry a foldable screen. Further, the first surface 11 of the carrying plate 1 may be provided with two bumps 6 spaced apart along an axial direction of the first coupling shaft 3, and the foldable screen may be located between the two bumps 6. The carrying plate 1 may have a strip structure and may extend along the axial direction of the first coupling shaft 3. The two bumps 6 may be respectively arranged at two ends of the carrying plate 1 in the axial direction of the first coupling shaft 3. The carrying plate 1 may be provided with a fixing shaft 5 on respective sides in a preset direction. The preset direction may be parallel to the carrying plate 1 and perpendicular to the first coupling shaft 3. The number of the fixing shafts 5 provided on either side of the carrying plate 1 with respect to the first coupling shaft 3 may be two, and the two fixing shafts 5 are arranged coaxially and parallel to the first coupling shaft 3.

Figure 7:
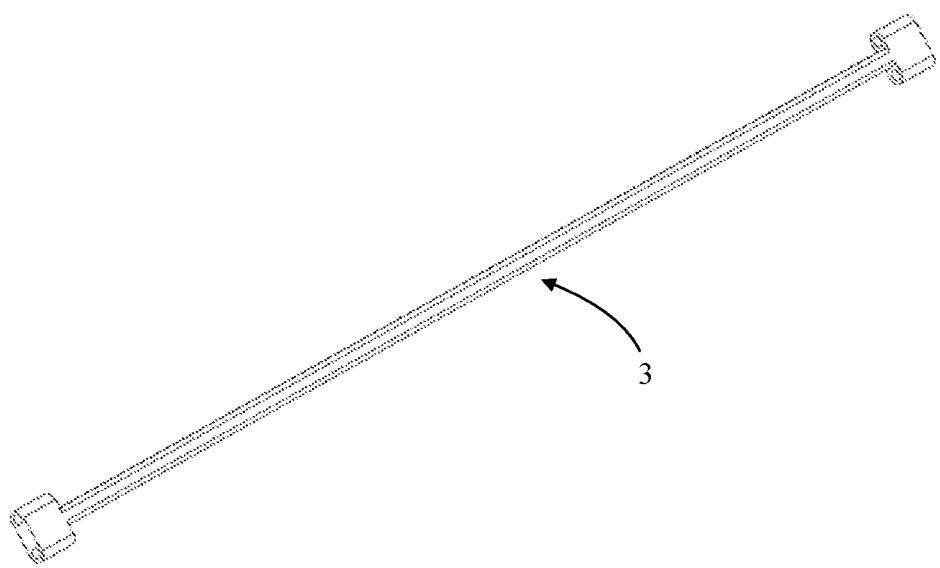
FIG. 7 illustrates a schematic view of a supporting piece of a support structure according to an embodiment of the present disclosure.
Figure 8:
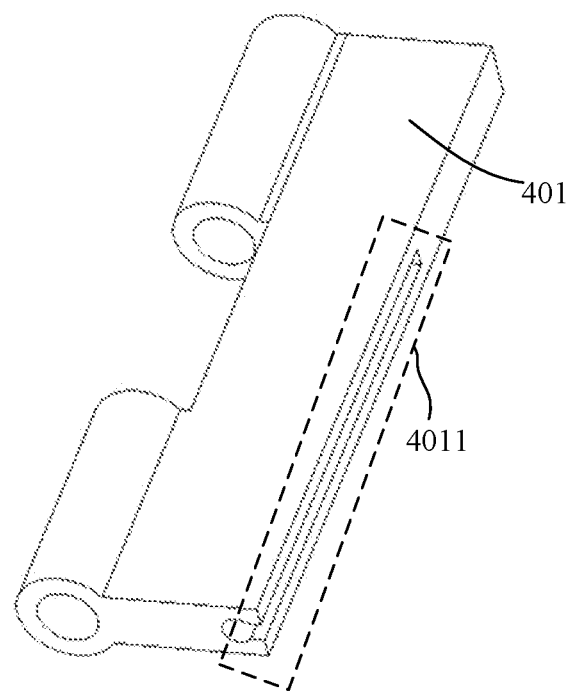
FIG. 8 illustrates a schematic view of a first connecting piece of a supporting structure according to an embodiment of the present disclosure.

As illustrated in FIG. 1, FIG. 2 and FIG. 7, the supporting assembly 2 is configured to support the carrying plate 1. The supporting assembly may include two supporting members 2, namely a first supporting member 21 and a second supporting member 22. The first supporting member 21 and the second supporting member 22 may be rotatably connected to the surface of the carrying plate 1 facing away from the foldable screen, that is, the first supporting member 21 and the second supporting member 22 are both connected to the second surface. Rotation axes of the first supporting member 21 and the second supporting member 22 may be parallel to each other and parallel to the carrying plate 1. The first supporting member 21 and the second supporting member 22 may be respectively connected to a side of the carrying plate 1 in the preset direction. Taking the carrying plate 1 provided with a fixing shaft 5 on both sides in the preset direction as an example, the first supporting member 21 can be rotatably connected with the fixing shaft 5 on one side of the carrying plate 1, and the second supporting member 22 can be rotatably connected with the fixing shaft 5 on the other side of the carrying plate 1. Each supporting member 2 may have a strip structure and may extend in the axis direction of the first coupling shaft 3. Taking the number of fixing shafts 5 provided on either side of the carrying plate 1 being two as an example, the two ends of the first supporting member 21 and the second supporting member 22 in the extending direction may both connected to the carrying plate 1 through the fixing shafts 5.

As illustrated in FIGS. 4, 5, 6 and 12, the first coupling shaft 3 is located on a side of the carrying plate 1 facing away from the foldable screen, and is located between the first supporting member 21 and the second supporting member 22. The first coupling shaft 3 is arranged in parallel with a rotation axis of the first supporting member 21 and the second supporting member 22. The first coupling shaft 3 may be located at a position on a middle line of the first supporting member 21 and the second supporting member 22. An outer peripheral surface of the first coupling shaft 3 may be provided with a first limiting member 301 and a second limiting member 302. The first limiting member 301 and the second limiting member 302 are spaced apart in an axial direction of the first coupling shaft 3. The first limiting member 301 may be an annular boss. The second limiting member 302 may be a circlip. The outer peripheral surface of the first coupling shaft 3 may be provided with a snap groove 303 that matches the circlip.

As illustrated in FIGS. 3 and 4, the first connecting assembly 4 is configured to connect the supporting assembly and the first coupling shaft 3. The first connecting assembly 4 may include a first connecting piece 401 and a second connecting piece 402. The first connecting piece 401 is rotatably connected to the first coupling shaft 3 and is rotatably connected to the first supporting member 21, and the second connecting piece 402 is rotatably connected to the first coupling shaft 3 and is rotatably connected to the second supporting member 22. The first connecting piece 401 may be connected to an end of the first supporting member 21 away from the carrying plate 1, and the second connecting piece 402 may be connected to an end of the second supporting member 22 away from the carrying plate 1. In a case that the first coupling shaft 3 is at the first position, the ends of the first connecting piece 401 and the second connecting piece 402 away from the first coupling shaft 3 are both located at a side of the first coupling shaft 3 away from the carrying plate 1 in a direction perpendicular to the carrying plate 1, that is, an end of the first connecting piece 401 connected to the first supporting member 21 is located on the side of the first coupling shaft 3 away from the carrying plate 1, and an end of the second connecting piece 402 connected to the second supporting member 22 is located on the side of the first coupling shaft 3 away from the carrying plate 1, the included angle between the first connecting piece 401 and the second connecting piece 402 is kept at a first angle, and the first supporting member 21 and the second supporting members 22 are all inclined relative to the carrying plate 1. In a case that the first coupling shaft 3 is located at the second position, the included angle between the first connecting piece 401 and the second connecting piece 402 is kept at a second angle, the first supporting member 21 and the second supporting member 22 are arranged opposite to each other so as to support the carrying plate 1, wherein the second position is located on a side of the first position away from the carrying plate 1. The second angle is greater than the first angle, and the second angle may be 180°, which is not limited in the embodiments of the present disclosure. In a process that the first coupling shaft 3 moves from the first position to the second position, the first and second supporting members 21 and 22 inclined with respect to the carrying plate 1 can rotate in a direction away from the carrying plate 1. Both the first connecting piece 401 and the second connecting piece 402 may have a plate-shaped structure, which is not limited in the present disclosure.

As illustrated in FIG. 1 and FIG. 2, the supporting structure further includes a second coupling shaft and a second connecting assembly. The first coupling shafts 3 and the second coupling shaft are coaxially arranged and spaced apart in the axial direction of the coupling shafts 3. The first coupling shafts 3 and the second coupling shaft correspond to the first connecting assembly and the second connecting assembly respectively. The first connecting piece 401 and the second connecting piece 402 of each connecting assembly are both rotatably connected to a corresponding coupling shaft 3. Taking the supporting members 21 and 22 having a strip structure as an example, in the axial direction of the coupling shaft 3, both ends of each supporting member are rotatably connected with a connecting piece. Taking the carrying plate 1 having a strip structure as an example, in the axial direction of the first coupling shaft 3, an end of the first coupling shaft 3 away from the second coupling shaft can extend out of the carrying plate 1.

As illustrated in FIG. 3 to FIG. 5 and FIG. 10, each of the first connecting assembly 4 and the second connecting assembly may include a first connecting piece 401 and a second connecting piece 402 respectively. In the axial direction of the first coupling shaft 3, a side of the first connecting piece 401 facing the second connecting piece 402 is provided with a telescopic member, and a side of the second connecting piece 402 facing the first connecting piece 401 is provided with a recessed portion 4051. In a case that the first coupling shaft 3 is located at the first position, the telescopic member enters the recessed portion 4051 to keep the included angle between the first connecting piece 401 and the second connecting piece 402 at the first angle; and in a case that the first coupling shaft 3 is located at the second position, the telescopic member escapes from the recessed portion 4051 and abuts against the second connecting piece 402, so that the included angle between the first connecting piece 401 and the second connecting piece 402 is kept at the second angle.

As illustrated in FIGS. 4, 5 and 8 to 12, the telescopic member may include an elastic member 404 and a first sleeve 403 slidable in the axial direction of the coupling shaft 3. The elastic member 404 may be a spring. Wherein, a side of the first connecting piece 401 adjacent to the first coupling shaft 3 may be provided with a sliding groove 4011 extending along the axial direction of the first coupling shaft 3, and the first sleeve 403 is provided with a slider 4032 slidably engaged with the sliding groove 4011. The second connecting piece 402 may be provided with a second sleeve 405. The first sleeve 403 and the second sleeve 405 can be rotatably sleeved on the first coupling shaft 3, and both are located between the first limiting member 301 and the second limiting member 302. The elastic member 404 abuts between the first limiting member 301 and the first sleeve 403. The spring is in a state of compression deformation. The second sleeve 405 abuts between the first sleeve 403 and the second limiting member 302. An end surface of the first sleeve 403 facing the second sleeve 405 is provided with a protruding portion 4031, and the recessed portion 4051 is provided on an end surface of the second sleeve 405 facing the first sleeve 403. In a case that the first coupling shaft 3 is at the first position, the protruding portion 4031 enters the recessed portion 4051, so that the telescopic member extends into the recessed portion 4051; in a case that the first coupling shaft 3 is at the second position, the first sleeve 403 moves toward the first limiting member 301, the compression force applied on the elastic member 404 becomes greater, the protruding portion 4031 comes out of the recessed portion 4051, and the end surface of the second sleeve 405 facing the first sleeve 403 abuts against the protruding portion 4031 outside of the recessed portion 4051.

Figure 9:
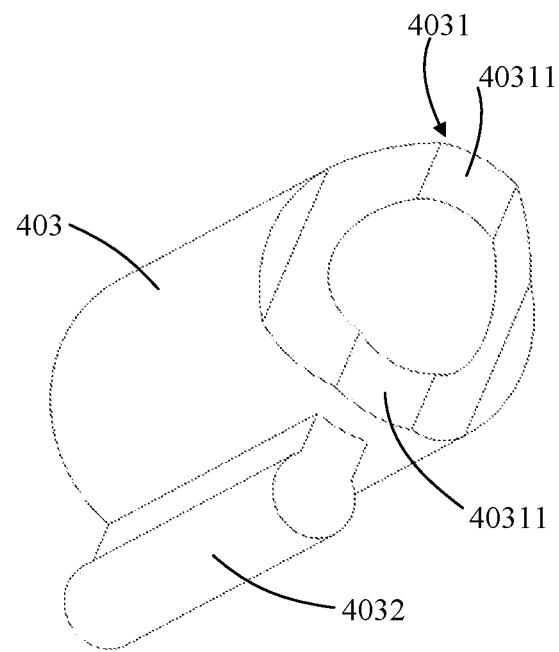
FIG. 9 illustrates a schematic view of a first sleeve of a support structure according to an embodiment of the present disclosure.
Figure 10:
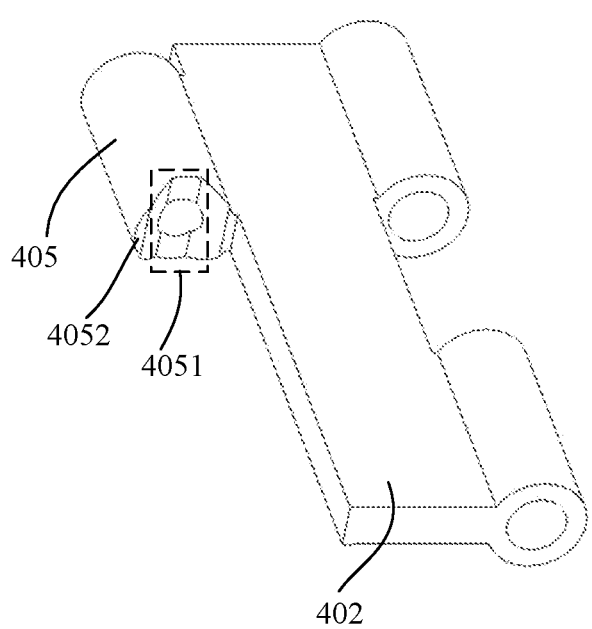
FIG. 10 illustrates a schematic view of a second connecting piece of a supporting structure according to an embodiment of the present disclosure.
Figure 11:
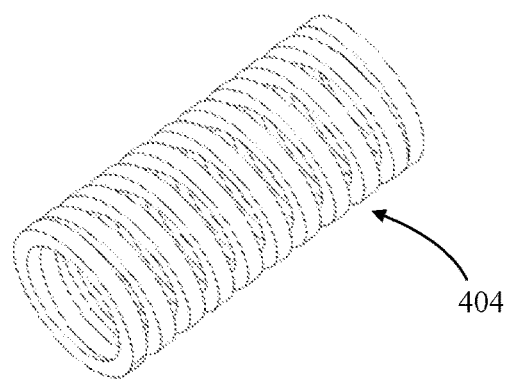
FIG. 11 illustrates a schematic view of an elastic member of a supporting structure according to an embodiment of the present disclosure.
Figure 12:
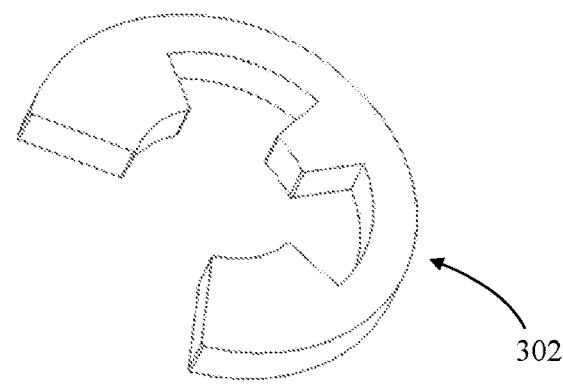
FIG. 12 illustrates a schematic view of a second limiting member of a supporting structure according to an embodiment of the present disclosure.

As illustrated in FIGS. 9 and 10, a side of the protruding portion 4031 away from the first limiting member 301 has a first abutting surface 40311. The end surface of the second sleeve 405 facing the first sleeve 403 has a second abutting surface 4052 outside of the recessed portion 4051. The first abutting surface 40311 and the second abutting surface 4052 are both perpendicular to the axial direction of the first coupling shaft 3. After the protruding portion 4031 comes out of the recessed portion 4051, the first abutting surface 40311 can engage the second abutting surface 4052 to increase a pressing force between the first sleeve 403 and the second sleeve 405, which in turn improves the stability of the supporting structure. In addition, there are two protruding portions 4031 and two recessed portion 4051, the two protruding portions 4031 can enter the two recessed portions 4051 in a one-to-one correspondence, and the two protruding portions 4031 are arranged along a radial direction of the first coupling shaft 3.

Figure 13:
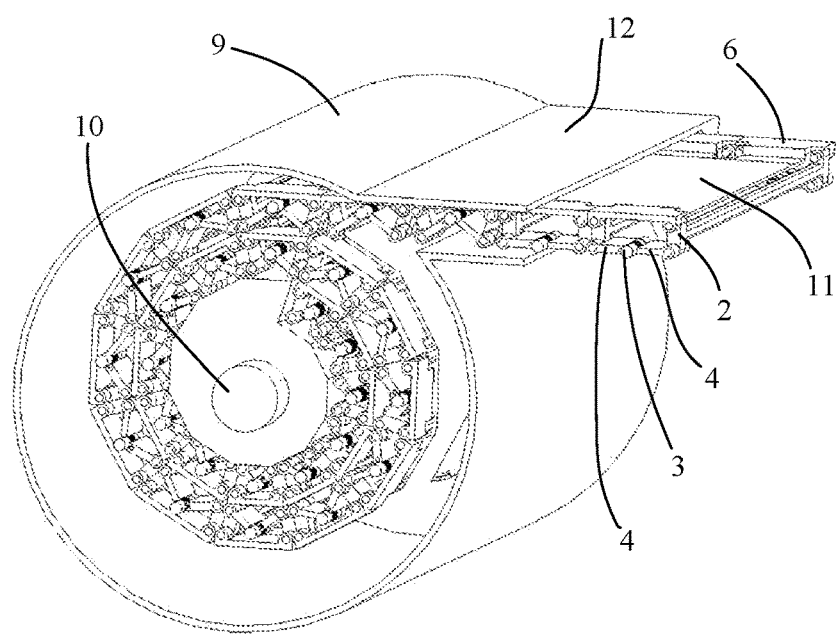
FIG. 13 illustrates a schematic view of a supporting device according to an embodiment of the present disclosure.
Figure 14:
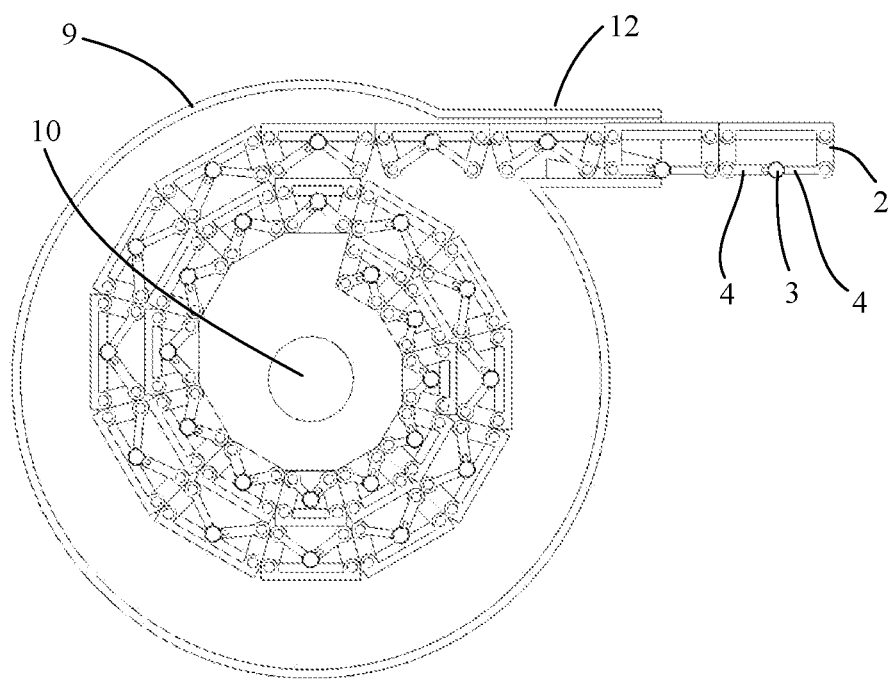
FIG. 14 illustrates a schematic plan view of a supporting device according to an embodiment of the present disclosure.

At least one embodiment of the present disclosure further provides a supporting device. As illustrated in FIGS. 13 and 14, the supporting device may include a supporting shaft 10 and the supporting structure described in any of the above embodiments. The number of the supporting structure may be plural, and a plurality of supporting structures are connected in sequence, a first coupling shafts 3 of the plurality of supporting structures are all parallel to the supporting shaft 10, and any two adjacent supporting structures are connected rotatably. In a case that the coupling shafts 3 of the plurality of supporting structures are all located at the first position, the plurality of supporting structures can be wound around the support shaft 10, and the first coupling shaft 3 of the support structure wound around the support shaft 10 is located on a side of the carrying plate 1 adjacent to the supporting shaft 10. In a case that the first coupling shafts 3 of the plurality of supporting structures are all located at the second position, the carrying plates 1 of the plurality of supporting structures are arranged on a plane to jointly support a foldable screen 11.

During the use of the supporting device according to the embodiments of the present disclosure, in a case that the first coupling shaft 3 is at the first position, the two supporting members 2 are both inclined with respect to the carrying plate 1 so that each supporting structure is in a storage state, thereby the plurality of supporting structures can be wounded around the supporting shaft 10 conveniently; and in a case that the first coupling shaft 3 is located at the second position, an included angle between the first connecting piece 401 and the second connecting piece 402 are kept at a second angle, the first supporting member 21 and the second supporting member 22 are disposed opposite to each other, so that the plurality of supporting structures can support the carrying plate 1.

Each component of the supporting device according to the embodiments of the present disclosure will be described in detail hereinafter:

As illustrated in FIGS. 1 and 16 to 18, the supporting device may further include a coupling member 8 to couple two adjacent supporting structures. The coupling shaft 8 includes a first shaft hole 801 and a second shaft hole 801 disposed parallel to each other and spaced apart. Taking the fixing shafts 5 on both sides of the carrying plate 1 in the preset direction as an example, for two adjacent supporting structures, the first shaft hole 801 of the coupling shaft 8 is rotatably sleeved on a fixing shaft of one supporting structure, and the second shaft hole 801 is rotatably sleeved on a fixing shaft of the other supporting structure, so that the two adjacent supporting structures are rotatably connected.

As illustrated in FIG. 14, in a case that the supporting device is in a wounded state, for a first supporting structure and a second supporting structure which are disposed adjacent to each other in a circumferential direction of the supporting shaft 10, a supporting member 2 of the first supporting structure adjacent to the second supporting structure has a first mating surface away from the first coupling shaft 3 thereof, and a supporting member 2 of the second supporting structure adjacent to the first supporting structure has a second mating surface away from the first coupling shaft 3 thereof, and the first mating surface and the second mating surface mate each other. In a case that the supporting device is in a wounded state, for a third supporting structure and a fourth supporting structure that are disposed adjacent to each other in a radial direction of the supporting shaft 10, the third supporting structure disposed closer to the supporting shaft with respect to the fourth supporting structure, two supporting members 2 of the third supporting structure have two surfaces away from a first coupling shaft 3 thereof, two supporting members 2 of the fourth structure have two surfaces away from a first coupling shaft 3 thereof, and the two surfaces of the supporting members of the third supporting structure are flush with the two surfaces of the supporting members of the fourth supporting structure, correspondingly.

As illustrated in FIG. 14, the plurality of supporting structures wounding around the support shaft 10 can include a plurality of supporting structure groups, each supporting structure group can include a second plurality of supporting structures, and the numbers of the second plurality supporting structures of the respective supporting structure groups are same, for example, there are six supporting structures in each supporting structure group, which is not limited in the present disclosure. Taking there being six supporting structures in each supporting structure group as an example, two end surfaces of each supporting structure of each supporting structure group in a circumferential direction of the supporting shaft 10 has an included angle of 30°. The plurality of supporting structure groups may include a first supporting structure group, a second supporting structure group, a third supporting structure group . . . a (n−1)-th supporting structure group, and an n-th supporting structure group connected in sequence, and n is greater than or equal to 2. The first supporting structure group is located at an initial winding position. sizes of the plurality of supporting structures of each supporting structure group are same, and a size of the supporting structures of the n-th supporting structure group is greater than a size of the supporting structures in the (n−1)-th supporting structure group. In the circumferential direction of the support shaft 10, two end surfaces of each supporting structure group are flush, that is, the outer surfaces of the supporting assemblies 2 at both ends of each supporting structure group are flush.

Figure 16:
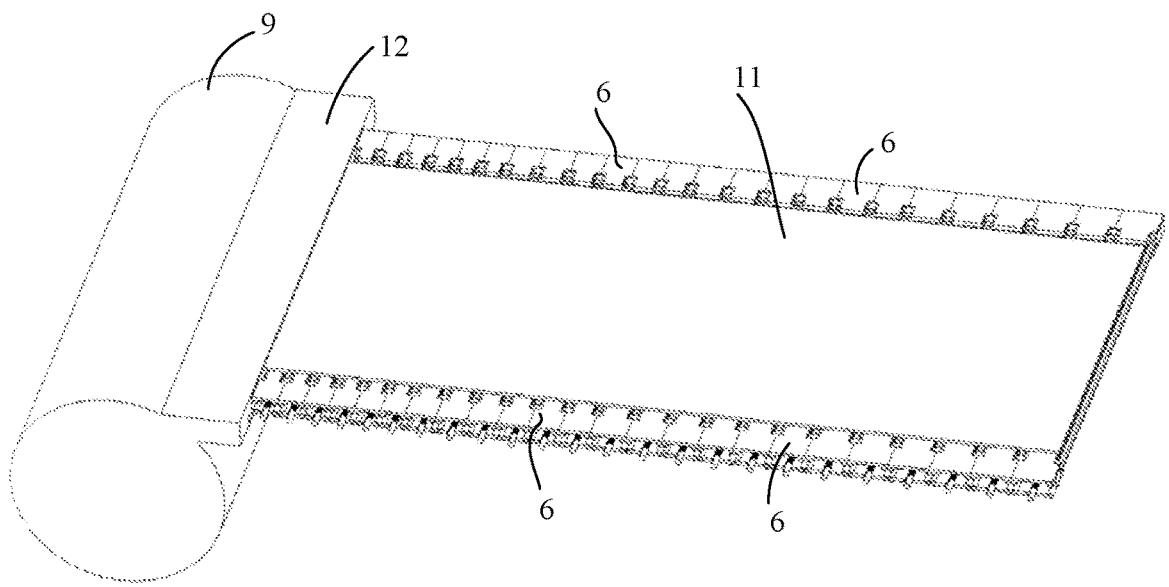
FIG. 16 illustrates a schematic view of a supporting device according to another embodiment of the present disclosure.
Figure 17:
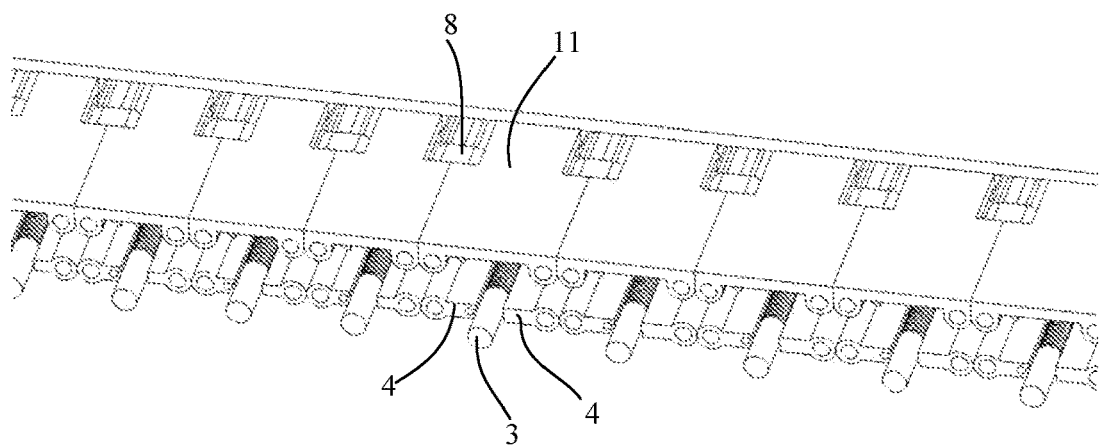
FIG. 17 illustrates a partial schematic view of a supporting device according to an embodiment of the present disclosure.
Figure 18:
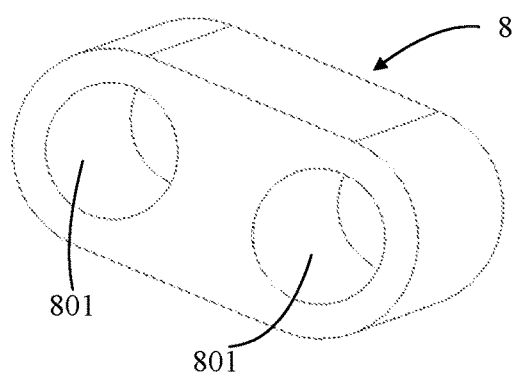
FIG. 18 illustrates a schematic view of a connecting piece in a supporting device according to an embodiment of the present disclosure.

As illustrated in FIGS. 1, 14 and 16, the plurality of supporting structures are configured to jointly carry the foldable screen 11. Taking the surface of the carrying plate 1 facing away from the coupling shaft 3 provided with two bumps 6 as an example, the foldable screen 11 carried on plurality of supporting structures may be located between the two bumps 6 of each carrying plate 1. In a case that the plurality of supporting structures are wounded around the supporting shaft 10, for two supporting structures that are disposed adjacent in the radial direction of the supporting shaft 10, the supporting members 21 and 22 of the supporting structure located outside is supported by the two bumps of the supporting structure located inside, thus, the supporting members 21 and 22 are kept from contacting the foldable screen 11 between the foldable members and the two bumps, thereby avoiding damage to the foldable screen 11.

Figure 15:
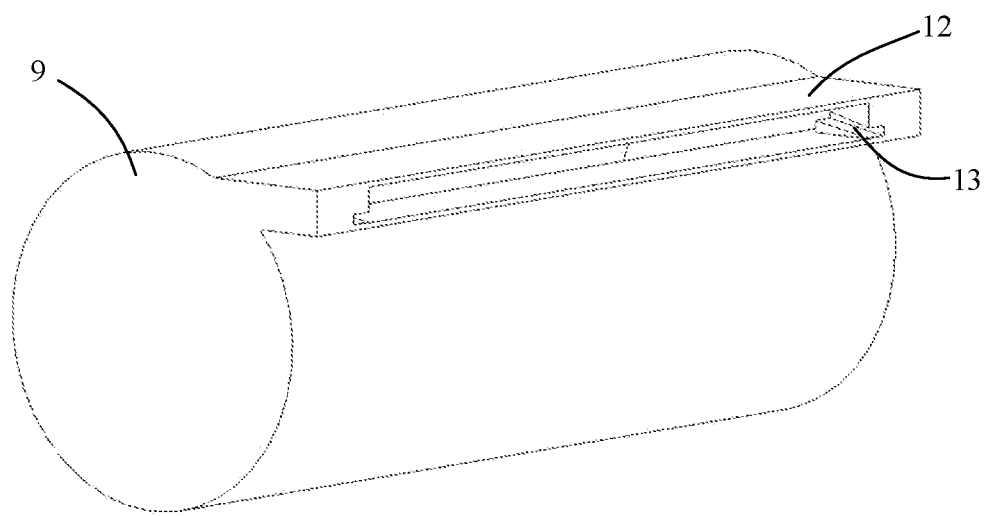
FIG. 15 illustrates a schematic view of a housing of a supporting device according to an embodiment of the present disclosure.

As illustrated in FIGS. 13 to 15, the supporting device may further include a housing 9 and a cylindrical member 12. The supporting shaft 10 is pivoted to the inner wall of the housing 9. The cylindrical member 12 has a first opening end and a second opening end in an axial direction of the cylindrical member 12. The cylindrical member 12 is connected to the housing 9 at the first opening end and communicates with the inside of the housing 9. Some of the plurality of supporting structures enter into the cylindrical member 12 at the first opening end and exit the cylindrical member 12 at the second opening end. An inner surface of the cylindrical member 12 may be provided with a guide 13. In a case that the supporting shaft 10 rotates in one direction of a clockwise direction and a counterclockwise direction, the support structure located in the cylindrical member 12 moves toward the first opening end, and the guide 13 guides the first coupling shaft 3 to approach the carrying plate 1, thus making the first coupling shaft 3 move to the first position; and in a case that the supporting shaft 10 rotates in the other direction of the clockwise direction and the counterclockwise direction, the supporting structure in the cylindrical member 12 moves toward the second opening end, and the guide 13 guides the first coupling shaft 3 to move away from the carrying plate 1, thus making the first coupling shaft 3 move to the second position.

In an embodiment of the present disclosure, as illustrated in FIG. 15, inner surfaces of the cylindrical member 12 includes a top surface (not shown) and a bottom surface (not shown) that are disposed opposite to each other, and a side surface (not shown) connecting the top surface and the bottom surface. There are two side surfaces and they are arranged opposite to each other. The side surface may be perpendicular to the top surface. The guide 13 includes a guide groove provided on the side surface. Taking the supporting structure just including a first coupling shaft 3 as an example, one side surface of the cylindrical member 12 is provided with a guide groove. Taking the supporting structure further including a second coupling shaft as an example, each of the two side surfaces of the cylindrical member 12 is provided with a guide groove. The guide groove is arranged obliquely with respect to the axial direction of the cylindrical member 12; along a direction from the first opening end to the second opening end, a distance between the guide groove and the top surface gradually increases, that is, a distance between the guide groove and the bottom surface gradually decreases. The guide groove may include two opposite groove walls, which is not limited in the present disclosure. For the support structure located in the cylindrical member 12, the top surface faces a side of the carrying plate 1 facing away from the first coupling shaft 3 and is parallel to the carrying plate 1. The first coupling shaft 3 can be engaged with the guide groove and slides in the guide groove, and in this way, the coupling shaft 3 is made far away from or close to the carrying plate 1.

At least one embodiment of the present disclosure further provides a foldable screen device. The foldable screen device may include a foldable screen and the supporting device described in any of the above embodiments. The foldable screen is carried on the carrying plates of the plurality of supporting structures. The foldable screen may be an organic electroluminescence display screen, which is not limited in the present disclosure. Since the supporting device included in the foldable screen device according to the embodiments of the present disclosure is the same as the supporting device according to the embodiments of the present disclosure, they can produce the same beneficial effects, which will not be elaborated herein.

The above are only the exemplary embodiments of the present disclosure, and do not limit the present disclosure in any form. Although the present disclosure has been disclosed as the exemplary embodiments, it is not intended to limit the present disclosure. Without departing from the scope of the technical solution of the present disclosure, one of ordinary skill in the art can make variations or modifications to the embodiments of the present disclosure. The variations or modifications without departing the scope of the present disclosure still fall into the protection scope of the present disclosure. The protection scope of the present disclosure is only limited in the appended claims.

The invention claimed is:

1. A supporting structure, comprising: a carrying plate, configured to carry a foldable screen in a parallel direction; a supporting assembly, comprising a first supporting member and a second supporting member, the first supporting member and the second supporting member both rotatably connected to both ends of the carrying plate respectively; a first coupling shaft, located between the first supporting member and the second supporting member and disposed parallel to the carrying plate and parallel to both a rotation axis of the first supporting member and a rotation axis of the second supporting member; and a first connecting assembly, comprising a first connecting piece and a second connecting piece, the first connecting piece rotatably connected to the first supporting member piece and rotatably connected to the first coupling shaft, and the second connecting piece rotatably connected to the second supporting member and rotatably connected to the first coupling shaft; wherein, in a case that the first coupling shaft is located at a first position, both an end of the first connecting piece away from the first coupling shaft and an end of the second connecting piece away from the coupling shaft are located at a side of the coupling shaft away from the carrying plate in a direction perpendicular to the carrying plate, the first connecting piece and the second connecting piece form a first included angle, and both the first supporting member and the second supporting member are inclined with respect to the carrying plate; and in a case that the first coupling shaft is located at a second position, the first connecting piece and the second connecting piece form a second included angle greater than the first included angle, and the first supporting member and the second supporting member are disposed opposite to each other so as to support the carrying plate, wherein the location of the first coupling shaft in the second position is on a side of the location of the first coupling shaft in the first position away from the carrying plate.

2. The supporting structure according to claim 1, wherein the first connecting piece comprises a telescopic member which is sleeved on the first coupling shaft and disposed adjacent to the second connecting piece in an axial direction of the first coupling shaft; and the second connecting piece comprises a recessed portion disposed on a side of the second connecting piece facing the first connecting piece; wherein in a case that the first coupling shaft is located at one position of the first position and the second position, the telescopic member enters the recessed portion, and in a case that the first coupling shaft is located at the other position of the first position and the second position, the telescopic member comes out of the recessed portion and abuts against the second connecting piece.

3. The supporting structure according to claim 2, wherein the first coupling shaft comprises a first limiting member and a second limiting member which are provided on a circumferential surface of the coupling shaft and disposed apart from each other in the axial direction of the first coupling shaft;
the telescopic member comprises an elastic member and a first sleeve which is rotatably sleeved on the first coupling shaft and is movable in the axial direction of the first coupling shaft;
the second connecting piece comprises a second sleeve which is rotatably sleeved on the first coupling shaft; the elastic member abuts the first limiting member and the first sleeve and disposed between the first limiting member and the first sleeve, the second sleeve abuts the first sleeve and the second limiting member and is disposed between the first sleeve and the second limiting member; and
the first sleeve comprises a protruding portion disposed on an end surface of the first sleeve facing the second sleeve, and the recessed portion is provided on an end surface of the second sleeve facing of the first sleeve;
wherein, in a case that the first coupling shaft is located at one of the first position and the second position, the protruding portion enters the recessed portion; and in a case that the first coupling shaft is located at the other of the first position and the second position, the protruding portion abuts an area other than the recessed portion of the end surface of the second sleeve facing the first sleeve.

4. The supporting structure according to claim 3, wherein the protruding portion has a first abutting surface, and the end surface of the second sleeve facing the first sleeve has a second abutting surface in an area other than the recessed portion, both the first abutting surface and the second abutting surface are perpendicular to the axial direction of the first coupling shaft; and in a case that the first coupling shaft is located at the other of the first position and the second position, the first abutting surface engages the second abutting surface.

5. The supporting structure according to claim 3, wherein there are two protruding portions and two recessed portions, and the two protruding portions correspond to the two recessed portions respectively, and the two protruding portions are arranged along the radial direction of the first coupling shaft.

6. The supporting structure according to claim 1, wherein:
the carrying plate, the first supporting member and the second supporting member all have a strip structure and extend along the axial direction of the first coupling shaft;
the supporting structure further comprises a second coupling shaft and a second connecting assembly, the first coupling shaft and the second coupling shaft are coaxially arranged and spaced apart; and the second connecting assembly comprises a third connecting piece and a fourth connecting piece, the third connecting piece is rotatably connected to the first supporting member and is rotatably connected to the second coupling shaft, and the fourth connecting piece is rotatably connected to the second supporting member and rotatably connected to the second coupling shaft.

7. A supporting device, comprising:
a supporting shaft; and
a plurality of supporting structures according claim 1, which are connected in sequence, the first coupling shafts of the plurality of supporting structures are all parallel to the supporting shaft, and two adjacent supporting structures are rotatably connected;
wherein, in a case that the first coupling shafts of the plurality of supporting structures are located at the first position, the plurality of the supporting structures are operatively wounded around the supporting shaft, and for each supporting structure wounded around the supporting shaft, the first coupling shaft is located on a side of the carrying plate adjacent to the supporting shaft; and in a case that the first coupling shafts of the plurality of supporting structures are located at the second position, the carrying plates of the plurality of supporting structures are arranged on a plane and are configured to jointly carry the foldable screen.

8. The supporting device according to claim 7, further comprising:
a housing, wherein the support shaft pivoted to the inner wall of the housing;
a cylindrical member having a first opening end and a second opening end in an axial direction thereof, the cylindrical member connected to the housing at the first opening end and communicating with inside of the housing, wherein an inner surface of the cylinder member is provided with a guide; and
wherein some of the supporting structures of the plurality of supporting structures enter the cylindrical member at the first opening end, and come out of the cylindrical member at the second opening end; in a case that the supporting shaft rotates in a first direction, the supporting structure in the cylindrical member moves toward the first opening end, and the guide guides the coupling shaft to approach the carrying plate so that the coupling shaft moves to the first position; and
in a case that the supporting shaft rotates in a second direction opposite to the first direction, the supporting structure in the cylindrical member moves toward the second opening end, and the guide guides the coupling shaft to move away from the carrying plate, so that the coupling shaft moves to the second position.

9. The supporting device according to claim 8, wherein the inner surface of the cylindrical member comprises a top surface and a bottom surface that are disposed opposite to each other and a side surface connecting the top surface and the bottom surface; the guide comprises a guide groove provided in the side surface, wherein a distance between the guide groove and the top surface gradually increases in a direction from the first opening end to the second opening end; and
for each supporting structure in the cylindrical member, the first surface thereof faces the top surface and is parallel to the top surface, and the first coupling shaft is slidingly engaged in the guide groove.

10. The supporting device according to claim 7, wherein each of the supporting structure comprises a first fixing shaft and a second fixing shaft respectively disposed a side of the carrying plate with respect to the first coupling shaft, the first fixing shaft and the second fixing shaft are disposed parallel to the coupling shaft, and the supporting device further comprises:
a coupling member, having a first shaft hole and a second shaft hole disposed parallel to each other, wherein, for two adjacent supporting structures, the first shaft hole is rotatably sleeved on the first fixing shaft of one supporting structure of the two adjacent supporting structures, and the second shaft hole is rotatably sleeved on the second fixing shaft of the other supporting structure of two adjacent supporting structures, so that the two adjacent supporting structures are rotatably connected.

11. The supporting device according to claim 10, wherein the first supporting member is rotatably sleeved on the first fixing shaft, and the second supporting member is rotatably sleeved on the second fixing shaft, so that the supporting assembly is rotatably connected to the carrying plate; in the case that a plurality of the supporting structures are wounded around the supporting shaft, for two supporting structures which are adjacent to each other in a circumferential direction of the supporting shaft, surfaces of the supporting assemblies away from the first coupling shaft thereof are mated with each other.

12. The supporting device according to claim 11, wherein for two supporting structures which are adjacent to each other in a radial direction of the supporting shaft, surfaces of the first supporting member and the second supporting member of one supporting structure away from the first coupling shaft thereof are flush with surfaces of the first supporting member and the second supporting member of the other supporting structure away from the first coupling shaft thereof in the radial direction.

13. The supporting device according to claim 7, wherein each of the plurality of supporting structures comprises two bumps disposed on a surface of the carrying plate configured to carry the foldable screen and arranged apart in the axial direction of the coupling shaft, and the foldable screen is located between the two bumps.

14. The supporting device according to claim 13, wherein, for two supporting structures which are adjacent to each other in a radial direction of the supporting shaft, the supporting assembly of the supporting structure that is relatively far from the supporting shaft is lapped on the two bumps of the supporting structure that is relatively close to the supporting shaft.

15. The supporting device according to claim 7, wherein the plurality of supporting structures comprises a plurality of supporting structure groups, the numbers of supporting structures of respective supporting structure groups are the same, and a size of the supporting structures of respective supporting structure group are the same, and each support structure group form a circle around the support shaft in a wounded state.

16. A foldable screen device, comprising;
the supporting device according to claim 7; and
a foldable screen, carried on the carrying plate of each supporting structure.

* * * * *